(12) United States Patent
Chen et al.

(10) Patent No.: US 9,041,051 B2
(45) Date of Patent: May 26, 2015

(54) SEMICONDUCTOR DEVICE

(75) Inventors: Ze Chen, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/111,168

(22) PCT Filed: Jul. 5, 2011

(86) PCT No.: PCT/JP2011/065374
§ 371 (c)(1),
(2), (4) Date: Oct. 10, 2013

(87) PCT Pub. No.: WO2013/005304
PCT Pub. Date: Jan. 10, 2013

(65) Prior Publication Data
US 2014/0197451 A1    Jul. 17, 2014

(51) Int. Cl.
*H01L 29/36*    (2006.01)
*H01L 29/739*    (2006.01)
*H01L 29/861*    (2006.01)
(Continued)

(52) U.S. Cl.
CPC ........ *H01L 29/7393* (2013.01); *H01L 29/7397* (2013.01); *H01L 29/861* (2013.01); *H01L 29/063* (2013.01); *H01L 29/0696* (2013.01); *H01L 29/0834* (2013.01)

(58) Field of Classification Search
CPC .............. H01L 29/063; H01L 29/0696; H01L 29/0834; H01L 29/7393
See application file for complete search history.

(56) References Cited

U.S. PATENT DOCUMENTS 7,999,317 B2 *   8/2011   Lu et al. ................... 257/342
2008/0135972 A1 *   6/2008   Ikuta et al. ............... 257/492
(Continued)

FOREIGN PATENT DOCUMENTS

| JP | 01-276769 A | 11/1989 |
| JP | 02-230774 A | 9/1990 |
| JP | 2009-105265 A | 5/2009 |

(Continued)

OTHER PUBLICATIONS

Translation of the International Preliminary Report on Patentability (Chapter I) and Written Opinion of the International Searching Authority; PCT/JP2011/065374; issued on Jan. 16, 2014.

(Continued)

*Primary Examiner* — Shaun Campbell
*Assistant Examiner* — Raj R Gupta
(74) *Attorney, Agent, or Firm* — Studebaker & Brackett PC

(57) ABSTRACT

An insulated gate bipolar transistor having a gate electrode (7) and an emitter electrode (9) is provided in a transistor region. A termination region is arranged around the transistor region. A first N type buffer layer (18) is provided below an N type drift layer (1) in the transistor region. A P type collector layer (19) is provided below the first N type buffer layer (18). A second N type buffer layer (20) is provided below the N type drift layer (1) in the termination region. A collector electrode (21) is directly connected to the P type collector layer (19) and the second N type buffer layer (20). An impurity concentration of the second N type buffer layer (20) decreases as a distance from the collector electrode (21) decreases. The second N type buffer layer (20) does not form any ohmic contact with the collector electrode (21).

4 Claims, 20 Drawing Sheets

(51) Int. Cl.
*H01L 29/06* (2006.01)
*H01L 29/08* (2006.01)

(56) References Cited

U.S. PATENT DOCUMENTS

2009/0114946 A1  5/2009  Ueno
2010/0224907 A1  9/2010  Hara

FOREIGN PATENT DOCUMENTS

JP  2009-117634 A  5/2009
JP  2009-176772 A  8/2009
JP  2010-135526 A  6/2010

OTHER PUBLICATIONS

International Search Report; PCT/JP2011/065374; Sep. 20, 2011.
K. Nakamura et al,; "Advanced RFC Technology with New Cathode Structure of Field Limiting Rings for High Voltage Planar Diode"; Proceedings of The 22nd International Symposium on Power Semiconductor Devices & ICs; Hiroshima, Japan; Jun. 6-10, 2010; pp. 133-136.
An Office Action issued by the Korean Patent Office on Dec. 7, 2014, which corresponds to Korean Patent Application No. 10-2014-7002158 and is related to U.S. Appl. No. 14/111,168; with English language partial translation.

* cited by examiner

SEMICONDUCTOR DEVICE

TECHNICAL FIELD

The present invention relates to a semiconductor device including an IGBT (Insulated Gate Bipolar Transistor).

BACKGROUND ART

As power devices having a high withstand voltage (600 V or higher), semiconductor devices having an IGBT are used. In such a semiconductor device, a termination region is arranged around an active region in which the IGBT is provided.

Unlike a CMOS (complementary metal oxide semiconductor) transistor or the like used for an LSI (large scale integration), the IGBT which is a power semiconductor is required to be furnished with a breakdown capability such as a current breaking capability during turn-off operation in addition to a reduction of on-voltage, speed enhancement and improvement of current drive capability. Here, the current breaking capability refers to a maximum current density interruptible by the semiconductor device without causing destruction at the time of turn-off.

A semiconductor device is proposed, in which no P type collector layer exists in a termination region and an N type buffer layer is directly connected to a collector electrode (e.g., see FIG. 1 of Patent Literature 1). This makes it possible to lower carrier concentration during turn-off operation, facilitate depletion and thereby reduce electric field strength. In this way, it is possible to improve a current breaking capability during the turn-off operation.

CITATION LIST

Patent Literature

Patent Literature 1: Japanese Patent Application Laid-Open No. 2009-176772

SUMMARY OF INVENTION

Technical Problem

However, with a conventional semiconductor device, when a reverse withstand voltage is applied to an IGBT (emitter: high potential, collector: low potential), a forward bias diode is formed between a P type base layer of an active region and an N type buffer layer of a termination region. This results in a problem that the reverse voltage tolerance of the IGBT is low and a leakage current is generated in a reverse withstand voltage mode.

The present invention has been made to solve the above-described problems, and an object thereof is to provide a semiconductor device which can suppress a leakage current in the reverse withstand voltage mode.

Means for Solving the Problems

A semiconductor device according to the present invention includes: a transistor region in which an insulated gate bipolar transistor having a gate electrode and an emitter electrode is provided; and a termination region arranged around the transistor region, wherein a first N type buffer layer is provided below an N type drift layer in the transistor region, a P type collector layer is provided below the first N type buffer layer, a second N type buffer layer is provided below the N type drift layer in the termination region, a collector electrode is directly connected to the P type collector layer and the second N type buffer layer, an impurity concentration of the second N type buffer layer decreases as a distance from the collector electrode decreases, and the second N type buffer layer does not form any ohmic contact with the collector electrode.

Advantageous Effects of Invention

The present invention makes it possible to suppress a leakage current in the reverse withstand voltage mode.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
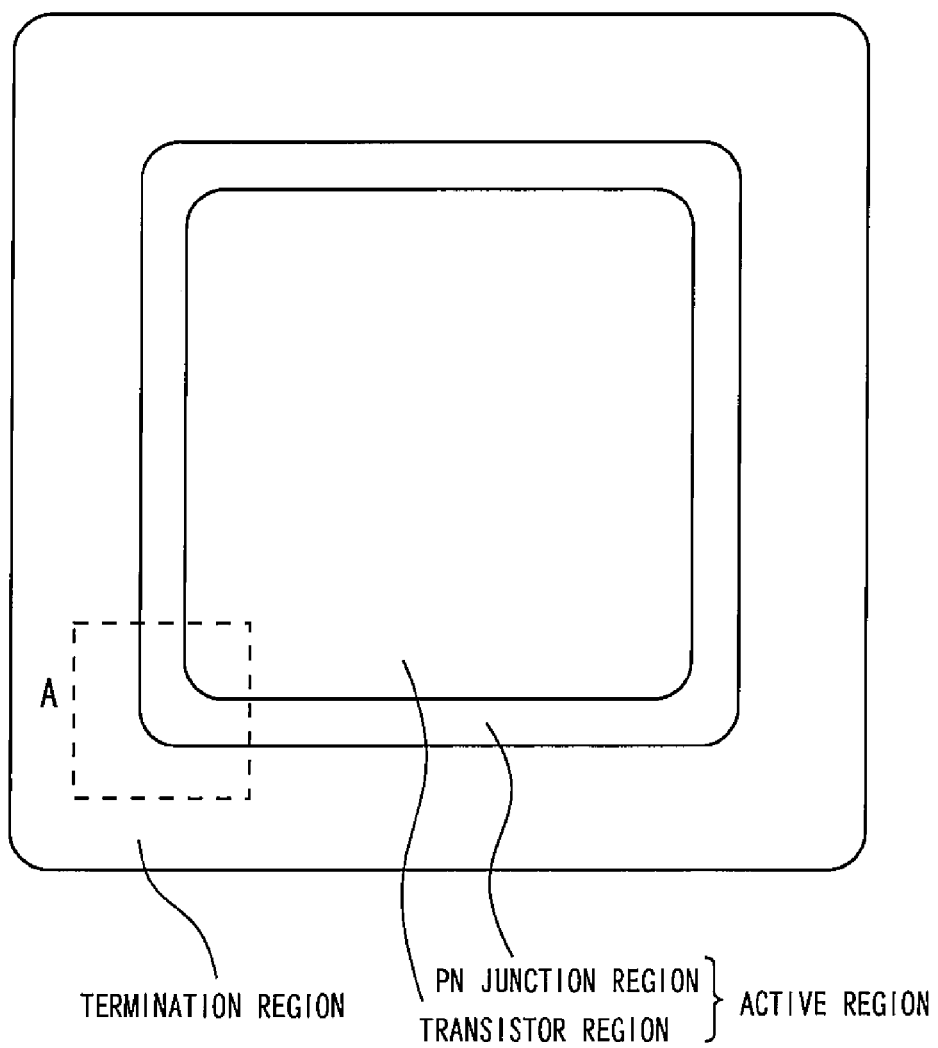
FIG. 1 is a top view illustrating a semiconductor device according to Embodiment 1 of the present invention.

FIG. 1 is a top view illustrating a semiconductor device according to Embodiment 1 of the present invention. This semiconductor device is a high withstand voltage (600 V or higher) power device including an IGBT. A termination region is arranged around an active region. The active region includes a transistor region provided with a plurality of trench gate type IGBT structures and a sampling region arranged between the transistor region and the termination region.

When the IGBT is turned on, a main current flows in the active region, whereas the main current does not flow in the termination region. Furthermore, while the IGBT is off, if a voltage is applied between the collector and the emitter, a depleted layer extends in a lateral direction of the device in the termination region. Therefore, the provision of the termination region allows the withstand voltage to be maintained.

Figure 2:
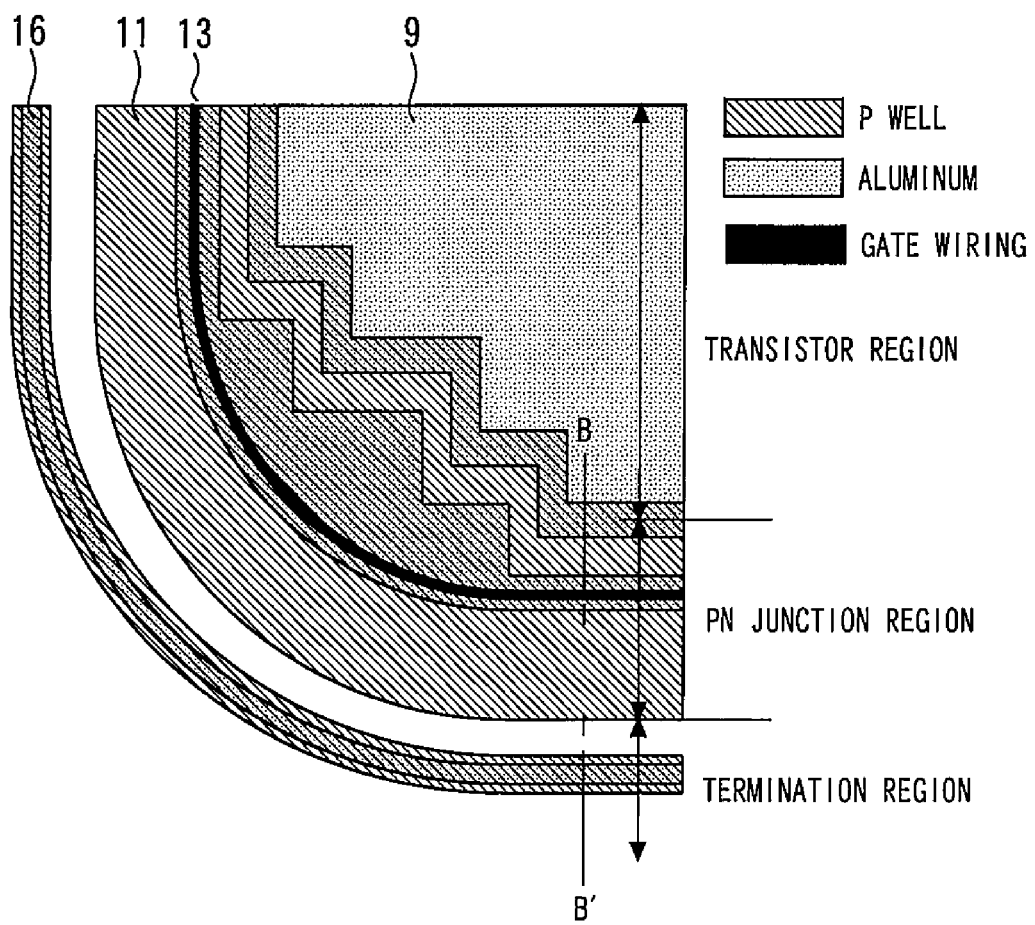
FIG. 2 is an enlarged top view of a region A in FIG. 1.
Figure 3:
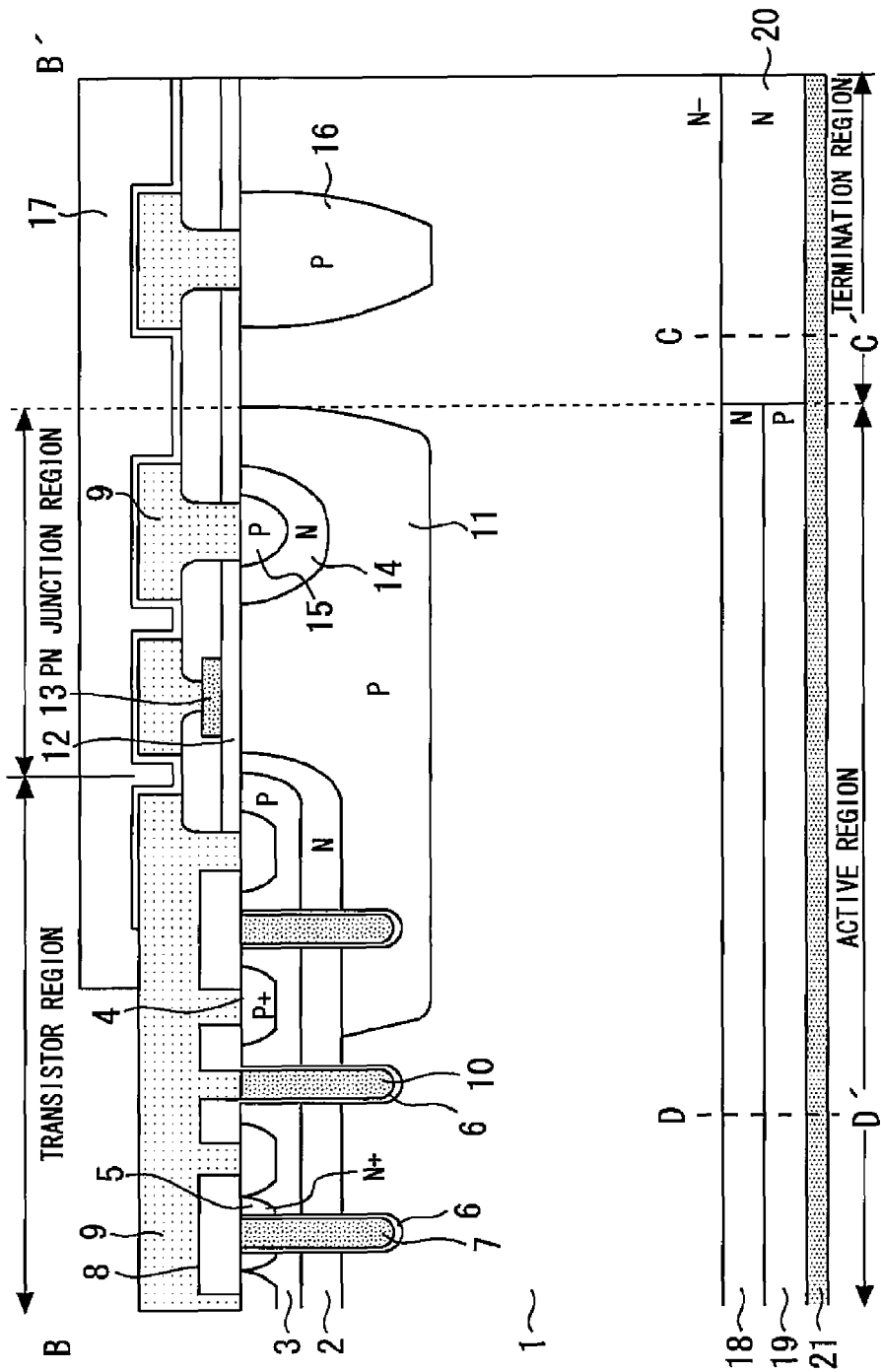
FIG. 3 is a cross-sectional view along B-B' of FIG. 2.

FIG. 2 is an enlarged top view of a region A in FIG. 1. FIG. 3 is a cross-sectional view along B-B' of FIG. 2.

In the transistor region, an N type charge storage layer 2 is provided on an N$^-$ type drift layer 1 and a P type base layer 3 is provided thereon. A type contact layer 4 and an N$^+$ type emitter layer 5 are provided on part of the P type base layer 3. Trenches are provided so as to penetrate the N$^+$ type emitter layer 5, the P type base layer 3 and the N type charge storage layer 2 and a gate electrode 7 is provided therein via a gate insulating film 6. An inter-layer insulating film 8 is provided on the gate electrode 7. An emitter electrode 9 is provided over the entire transistor region and connected to the P$^+$ type contact layer 4.

Dummy trenches are provided so as to penetrate the P type base layer 3 and the N type charge storage layer 2 and a gate wiring 10 is provided therein via the gate insulating film 6. The gate wiring 10 is connected to the emitter electrode 9. This configuration provides an effect of suppressing oscillation in the event of a short circuit or the like.

A P type layer 11 is provided on the N$^-$ type drift layer 1 in a PN junction region. A gate wiring 13 is provided on the P type layer 11 via an insulating film 12. The gate wiring 13 is arranged on an outer circumference of the transistor region and connected to the gate electrode 7. An N type layer 14 is provided on the P type layer 11 and a P type layer 15 is provided between the N type layer 14 and the emitter electrode 9. The N type layer 14 is connected to the emitter electrode 9 via the P type layer 15. This configuration does not operate as a MOS transistor and extracts extra carriers (holes) during turn-off operation. A boundary between the active region and the termination region is located at an outer edge of the P type layer 11.

In the termination region, a P type layer 16 is provided on part of the N$^-$ type drift layer 1. This P type layer 16 is a guard ring for increasing withstand voltage. The concentration, the depth and the number or the like of P type layers 16 are designed according to the withstand voltage maintained. A surface protective film 17 covers the emitter electrode 9 in part of the transistor region, the PN junction region and the termination region.

In the transistor region and the PN junction region, an N type buffer layer 18 is provided below the N$^-$ type drift layer 1 and a P type collector layer 19 is provided therebelow. In the termination region, an N type buffer layer 20 is provided below the N$^-$ type drift layer 1. A collector electrode 21 is directly connected to the P type collector layer 19 and the N type buffer layer 20.

Figure 4:
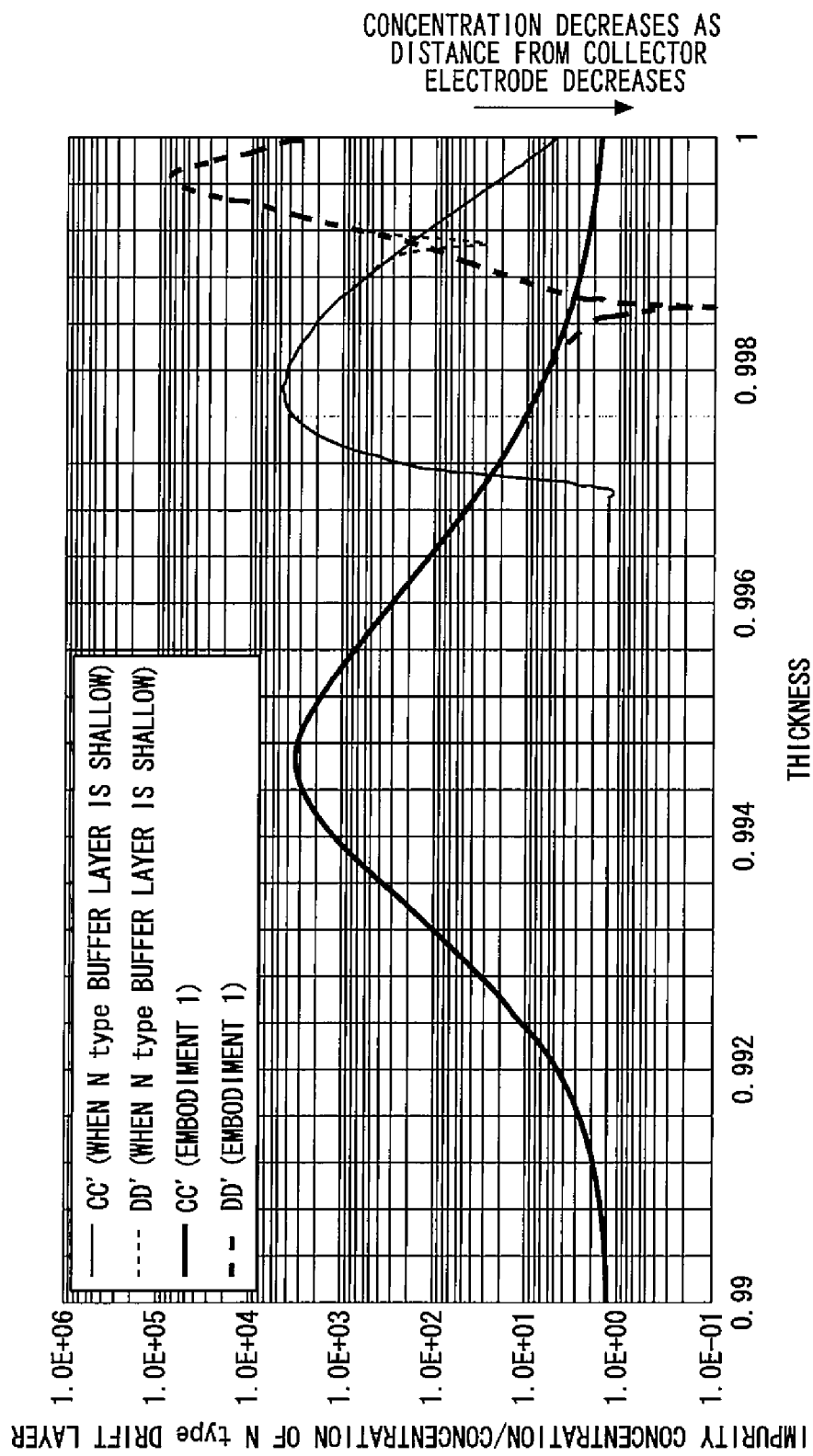
FIG. 4 is a diagram illustrating impurity concentration distributions along C-C' and D-D' in FIG. 3.

FIG. 4 is a diagram illustrating impurity concentration distributions along C-C' and D-D' in FIG. 3. In the present embodiment, the N type buffer layers 18 and 20 are formed deeply by means of impurity injection. For a comparison, a case is also shown where the N type buffer layers 18 and 20 are formed shallowly. The impurity concentration of the N type buffer layer 20 decreases as the distance from the collector electrode 21 decreases. In the present embodiment, since the N type buffer layer 20 is formed deeply, the impurity concentration of the N type buffer layer 20 is sufficiently small in the vicinity of an interface with the collector electrode 21. Therefore, the N type buffer layer 20 does not form any ohmic contact with the collector electrode 21.

Next, effects of Embodiment 1 will be described in comparison with comparative examples 1 to 3. Comparative examples 1 and 2 are different from Embodiment 1 in that a P type collector layer is provided in the termination region, and comparative example 1 is further different from Embodiment 1 in that neither the N type layer 14 nor the P type layer 15 is provided in the PN junction region. Comparative example 3 is different from Embodiment 1 in that the N type buffer layer 20 is formed shallowly and forms an ohmic contact with the collector electrode 21.

In the cases of comparative examples 1 and 2 where the P type collector layer is provided in the termination region, a carrier concentration on the emitter side does not decrease during turn-off operation on the boundary between the active region and the termination region and the electric field strength increases. A current density on the emitter side increases through accelerated impact ionization. As a result, the temperature rises locally, which causes thermal destruction, and the current breaking capability thereby deteriorates.

By contrast, in Embodiment 1 or comparative example 3, the P type collector layer is omitted in the termination region and the N type buffer layer 20 is directly contacted to the collector electrode 21. This reduces the possibility of carrier generation in the collector structure in the termination region during turn-off operation of the IGBT, and thereby accelerates depletion from the P type layer 11 to the collector side, causing the electric field strength to deteriorate. As a result, the current breaking capability during turn-off operation of the IGBT can be improved.

Figure 5:
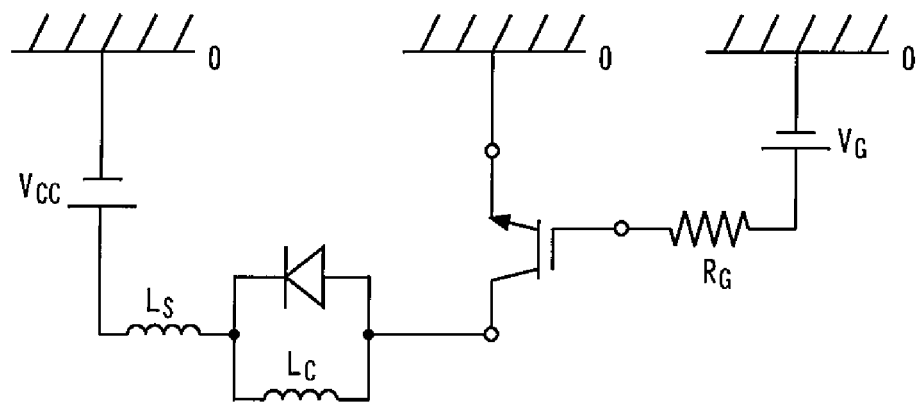
FIG. 5 is a diagram illustrating a circuit used for an experiment to evaluate turn-off characteristics.
Figure 6:
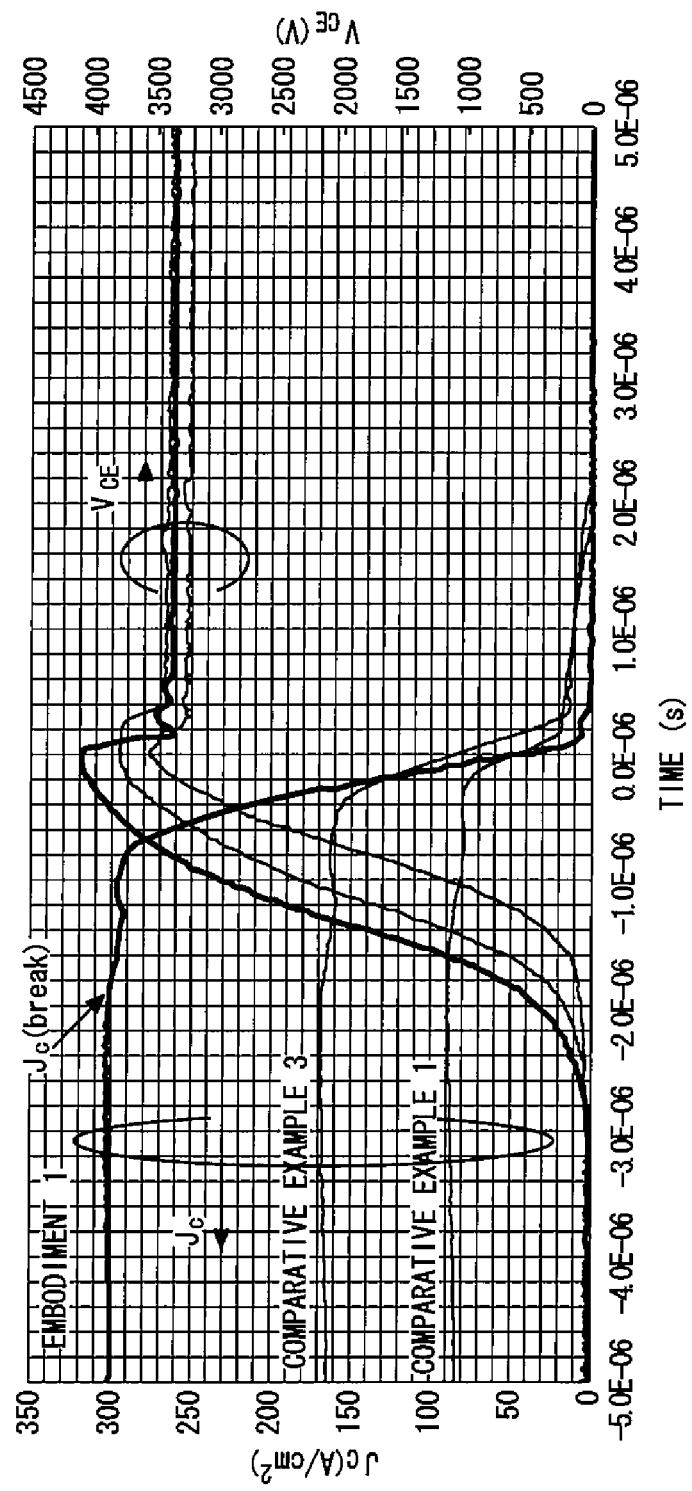
FIG. 6 is a diagram illustrating evaluation results of the turn-off characteristics using the circuit in FIG. 5.
Figure 7:
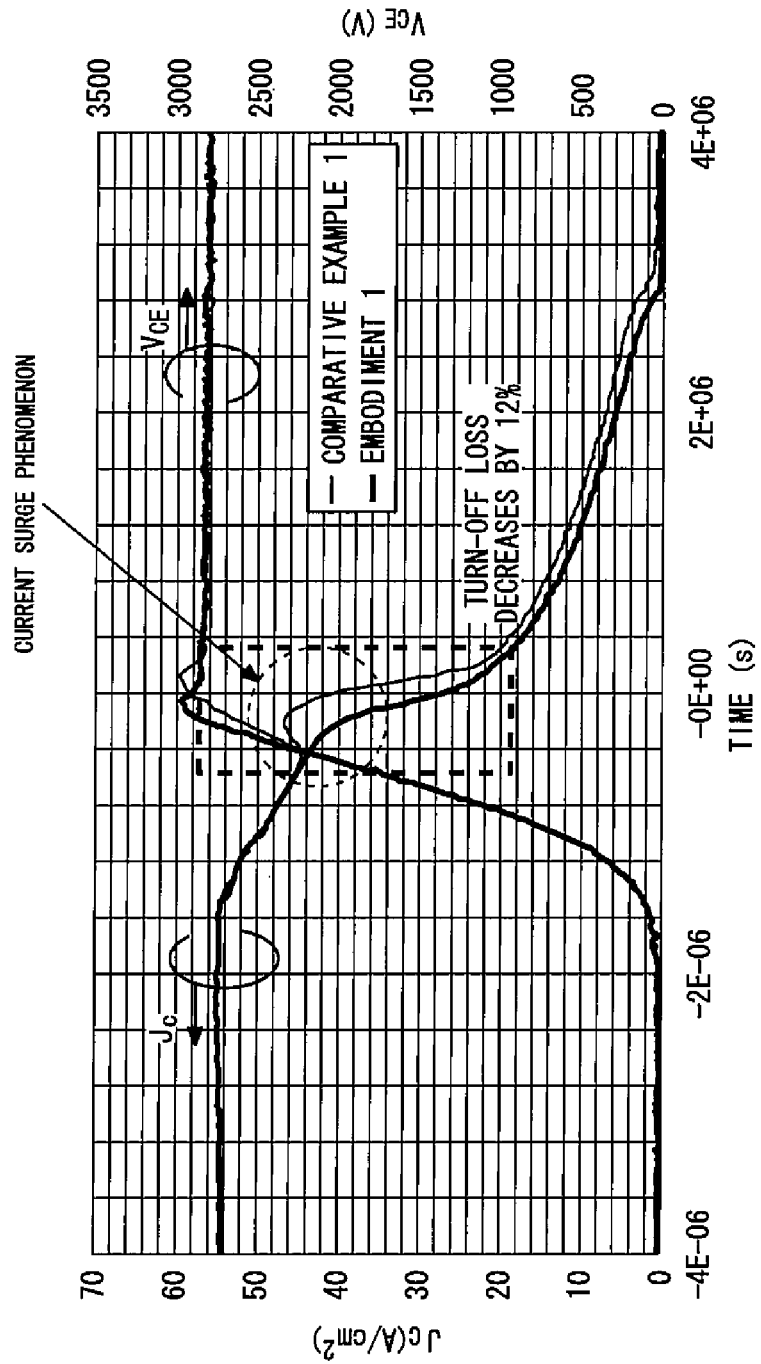
FIG. 7 is a diagram illustrating the evaluation results of turn-off characteristics performed using the circuit in FIG. 5.

FIG. 5 is a diagram illustrating a circuit used for an experiment to evaluate turn-off characteristics. FIG. 6 is a diagram illustrating evaluation results of the turn-off characteristics using the circuit in FIG. 5. The experiment uses a device having an IGBT structure with a withstand voltage of 4500 V. A voltage Vcc is 3400 V, an inductance Ls is 2.47 μH and a temperature Tj is 423K. By increasing a current density Jc from 56 A/cm$^2$ to 1.5 times, 2.0 times thereof, evaluations were performed until the device was destroyed. FIG. 7 is a diagram illustrating the evaluation results of turn-off characteristics performed using the circuit in FIG. 5. The experiment uses a device having an IGBT structure with a withstand voltage of 4500 V. A voltage Vcc is 3400 V, an inductance Ls is 2.47 μH, a temperature Tj is 398K, and a current density Jc is 56 A/cm$^2$. In Embodiment 1, since a current surge phenomenon disappeared, a turn-off loss decreased by 12%. When the IGBT turned on, concentration of holes in the PN junction region from the collector in the termination region was suppressed, and therefore the movement of carriers at the time of turn-off was relaxed.

Figure 8:
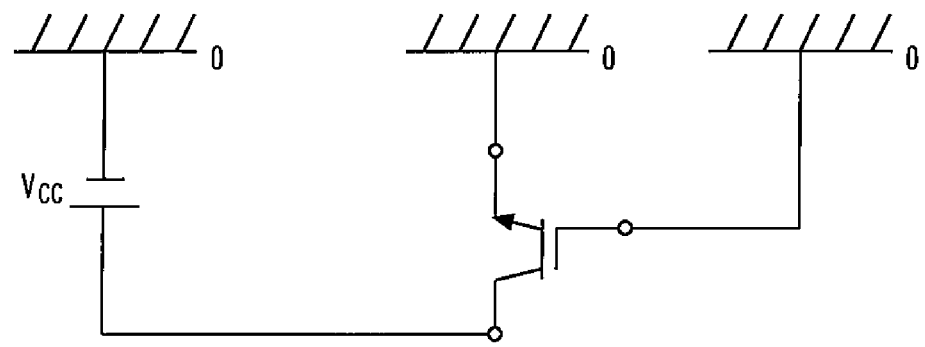
FIG. 8 is a diagram illustrating a circuit used for an experiment to evaluate withstand voltage characteristics.
Figure 9:
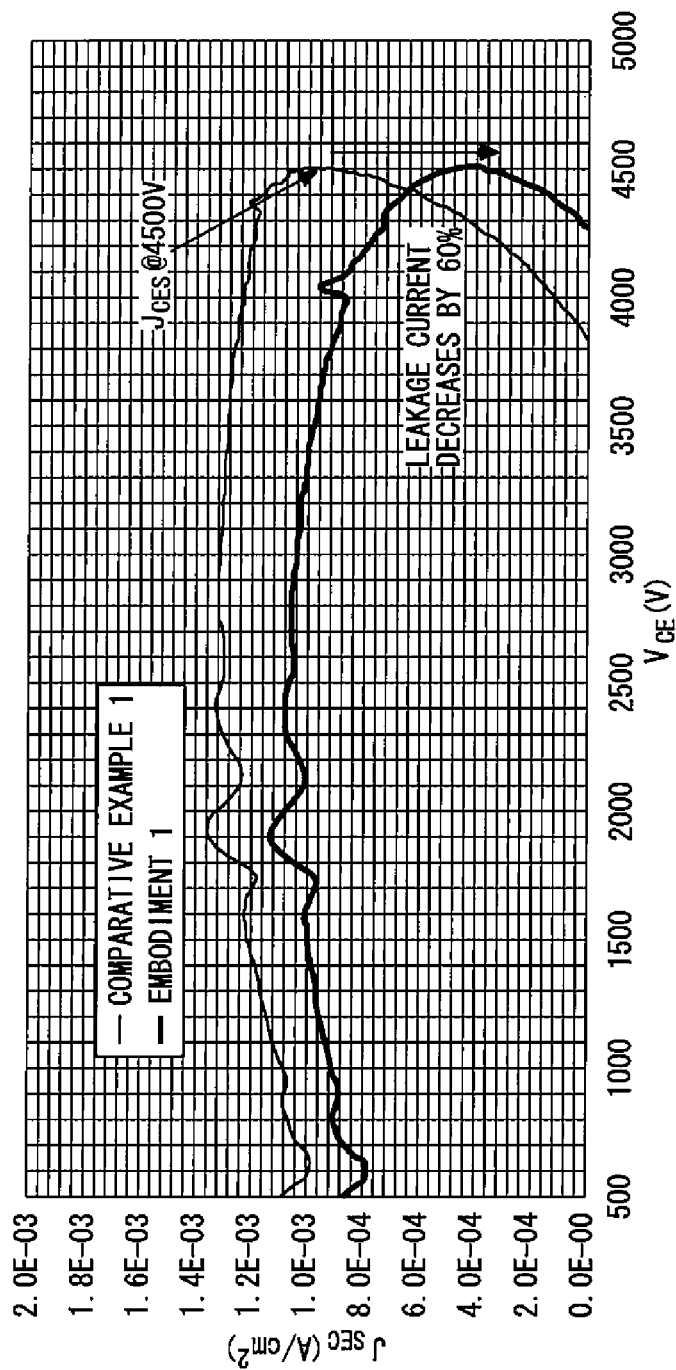
FIG. 9 is a diagram illustrating evaluation results of the withstand voltage characteristics using the circuit in FIG. 8.

FIG. 8 is a diagram illustrating a circuit used for an experiment to evaluate withstand voltage characteristics. FIG. 9 is a diagram illustrating evaluation results of the withstand voltage characteristics using the circuit in FIG. 8. The experiment uses a device having an IGBT structure with a withstand voltage of 4500 V. A gate voltage VGE is 0 V, a temperature Tj is 398K, and AC mode is used. In Embodiment 1, the leakage current decreased by 55% compared to comparative example 1. This is because the N type buffer layer 20 in the termination region suppressed hole injection from the collector side during turn-off operation of the IGBT.

Figure 10:
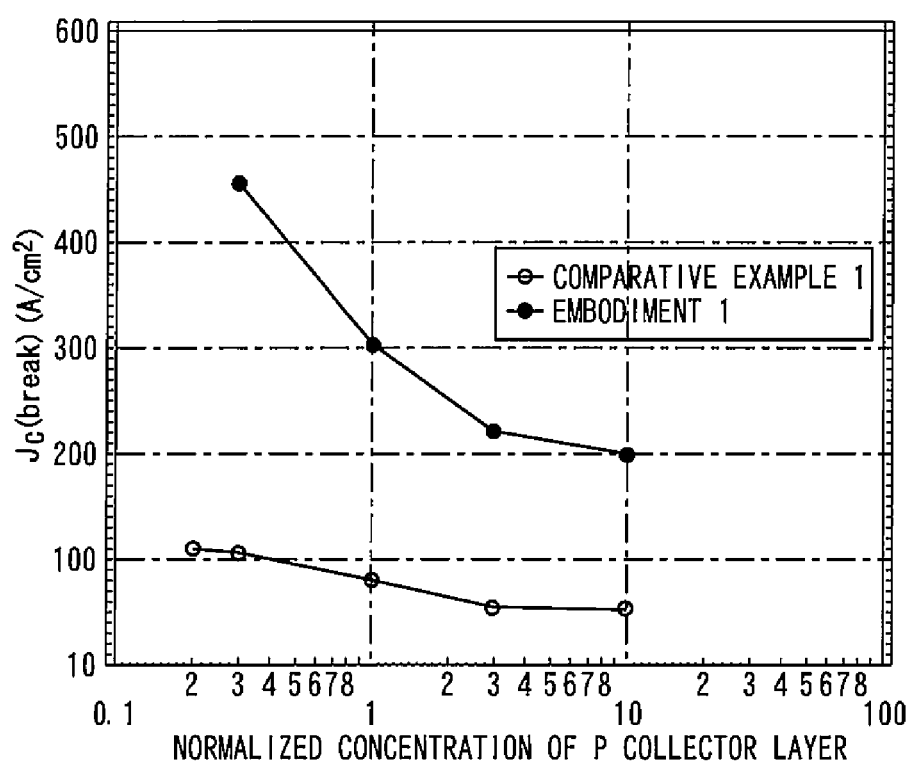
FIG. 10 is a diagram illustrating concentration dependency of the P collector layer on a turn-off breaking capability of the IGBT.
Figure 11:
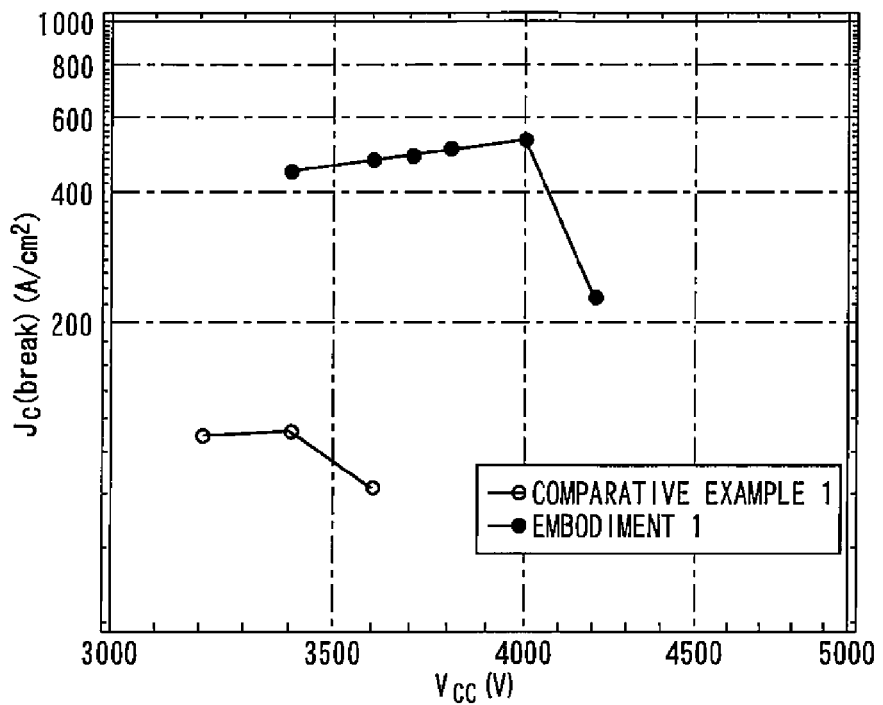
FIG. 11 is a diagram illustrating a safe operation region at the time of turn-off breaking of the IGBT.

FIG. 10 is a diagram illustrating concentration dependency of the P collector layer on a turn-off breaking capability of the IGBT. A supply voltage Vcc is 3400 V, a gate voltage VG is ±15 V, and a temperature is 423K. The ON-voltage and the turn-off breaking capability of the IGBT depend on the concentration of the P type collector layer 19. By contrast, in Embodiment 1, even when the concentration of the P type collector layer 19 changes, the breaking capability at the time of turn-off can be kept high. FIG. 11 is a diagram illustrating a safe operation region at the time of turn-off breaking of the IGBT. The temperature is 423K. Embodiment 1 can also expand a safe operation region at the time of turn-off breaking.

Furthermore, in the present embodiment, the N type buffer layer 20 does not form any ohmic contact with the collector electrode 21. When a reverse withstand voltage is applied to the IGBT (the emitter: high potential, the collector: low potential), this prevents formation of a forward bias diode between the P type base layer 3 of the active region and the N type buffer layer 20 of the termination region. As a result, the reverse voltage tolerance of the IGBT improves and a leakage current in the reverse withstand voltage mode can be suppressed.

Figure 12:
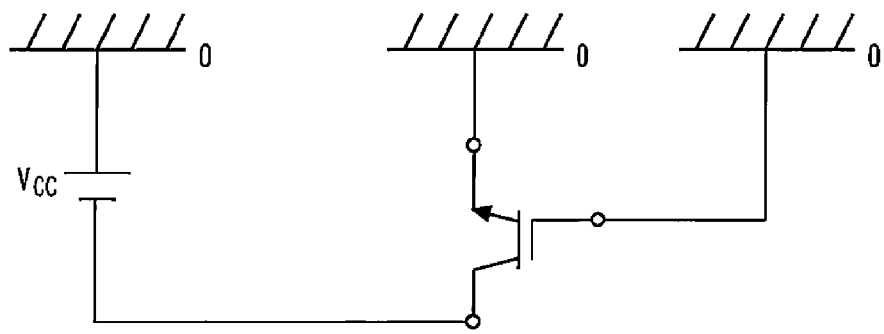
FIG. 12 is a diagram illustrating a circuit used for an experiment to evaluate reverse withstand voltage characteristics.
Figure 13:
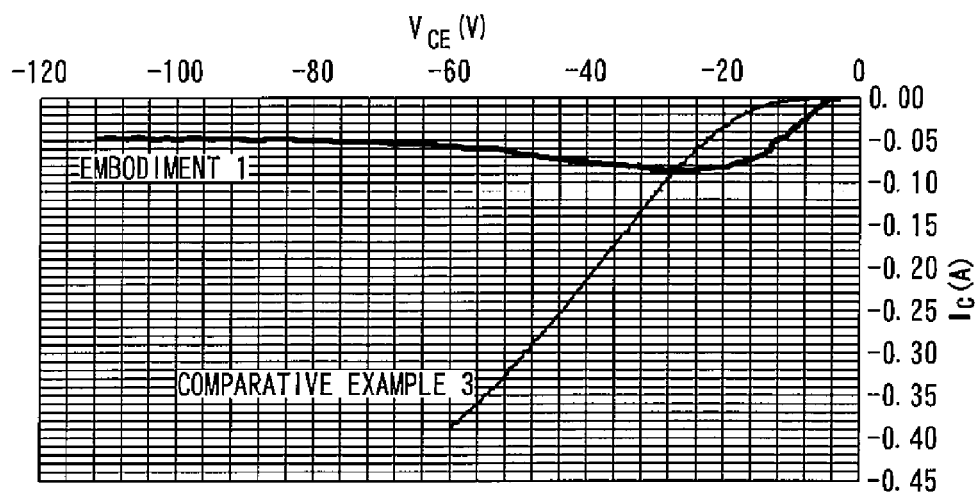
FIG. 13 is a diagram illustrating evaluation results of the reverse withstand voltage characteristics using the circuit in FIG. 12.

FIG. 12 is a diagram illustrating a circuit used for an experiment to evaluate reverse withstand voltage characteristics. FIG. 13 is a diagram illustrating evaluation results of the reverse withstand voltage characteristics using the circuit in FIG. 12. The experiment uses a device having an IGBT structure with a withstand voltage of 4500 V. A voltage Vcc is −100 V, a gate voltage VGE is 0 V, a temperature Tj is 298K, and AC mode is used. In Embodiment 1 where the N type buffer layer 20 does not form any ohmic contact with the collector electrode 21, the leakage current reduced to 10% or below compared to comparative example 3 where an ohmic contact is formed. This is because when a reverse withstand voltage is applied to the IGBT, a forward bias diode is prevented from being formed between the P type base layer 3 and the N type buffer layer 20, the reverse voltage tolerance of the IGBT improves and a leakage current in the reverse withstand voltage mode is suppressed.

Furthermore, Embodiment 1 provides the N type layer 14 and the P type layer 15 in the PN junction region. This resistance component makes it possible to suppress high local electric fields and suppress an ion impact phenomenon caused by high electric field strength. As a result, it is possible to suppress a local temperature rise and improve a current breaking capability during turn-off operation of the IGBT.

Figure 14:
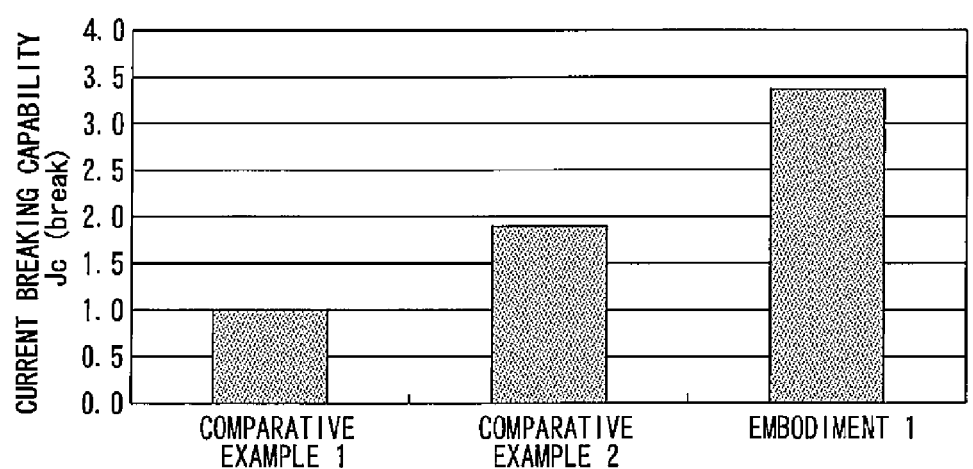
FIG. 14 is a diagram illustrating a comparison of a current breaking capability Jc (break) between comparative examples 1 and 2, and Embodiment 1.

FIG. 14 is a diagram illustrating a comparison of a current breaking capability Jc (break) between comparative examples 1 and 2, and Embodiment 1. As is obvious from this diagram, the current breaking capability in comparative example 2 where the N type layer 14 and the P type layer 15 are provided in the PN junction region is twice that in comparative example 1 where the N type layer 14 and the P type layer 15 are not provided. Furthermore, the current breaking capability in Embodiment 1 is 3.5 times that in comparative example 1.

Figure 15:
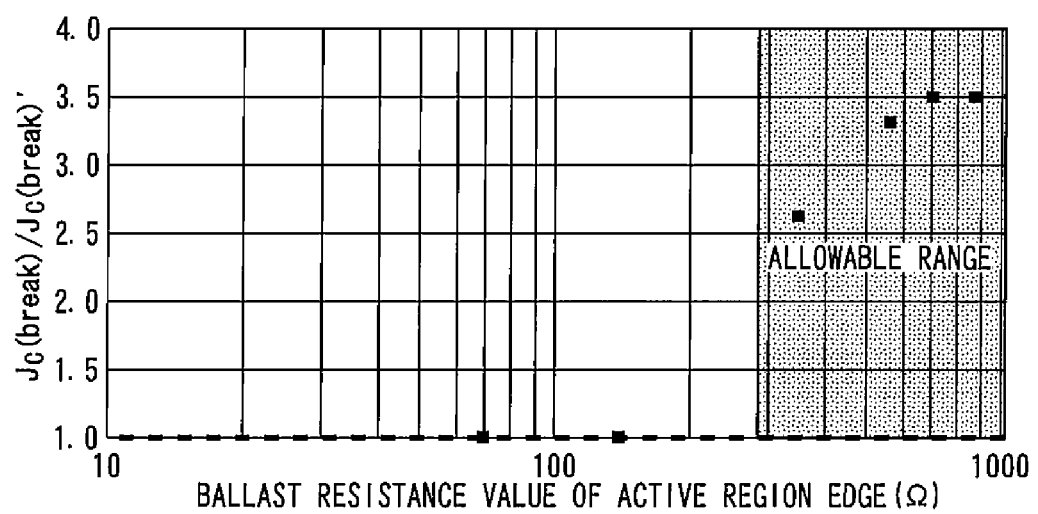
FIG. 15 is a diagram illustrating an allowable range of resistance values to which influences of the N type layer and the P type layer in the PN junction region are converted.

FIG. 15 is a diagram illustrating an allowable range of resistance values to which influences of the N type layer 14 and the P type layer 15 in the PN junction region are converted. The vertical axis shows values obtained by standardizing a maximum current density $J_c$ (break) interruptible by a device without destruction at the time of turn-off with reference to a value $J_c$ (break) in comparative example 1. Considering that comparative example 1 possesses only a current breaking capability with a normalized current density and twice or more of the normalized current density needs to be guaranteed as the current breaking capability, the value of the vertical axis needs to be 2.0 or more. Thus, the resistance value in the PN junction region needs to be set to 300Ω or more.

Figure 16:
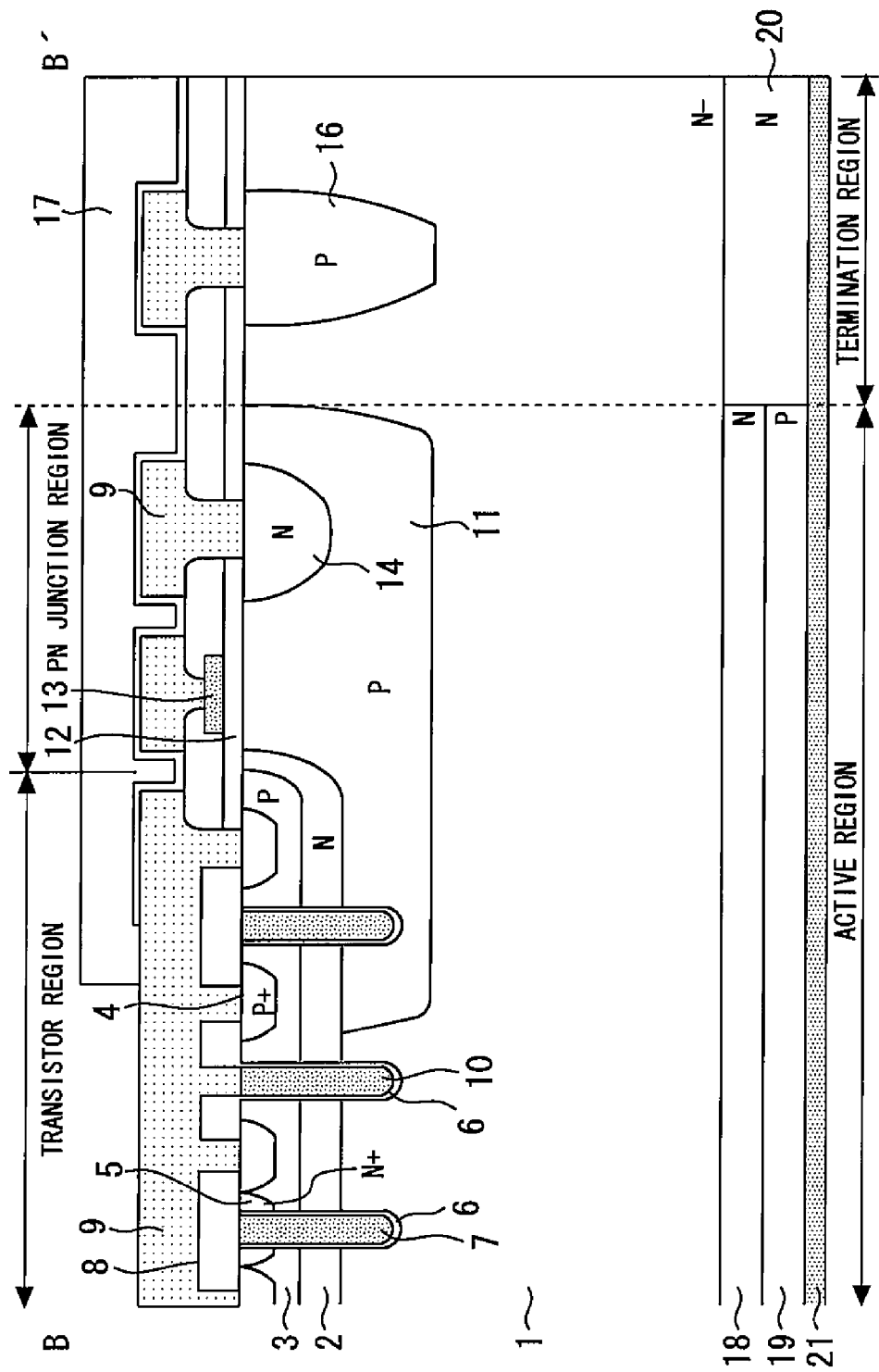
FIG. 16 is a cross-sectional view illustrating modification example 1 of the semiconductor device according to Embodiment 1 of the present invention.

FIG. 16 is a cross-sectional view illustrating modification example 1 of the semiconductor device according to Embodiment 1 of the present invention. Modification example 1 is different from Embodiment 1 in that there is no P type layer 15. In this case, the resistance component of the N type layer 14 can suppress a high local electric field in the PN junction region and suppress an ion impact phenomenon caused by high electric field strength. As a result, it is possible to suppress a local temperature rise and improve a current breaking capability during turn-off operation of the IGBT.

Figure 17:
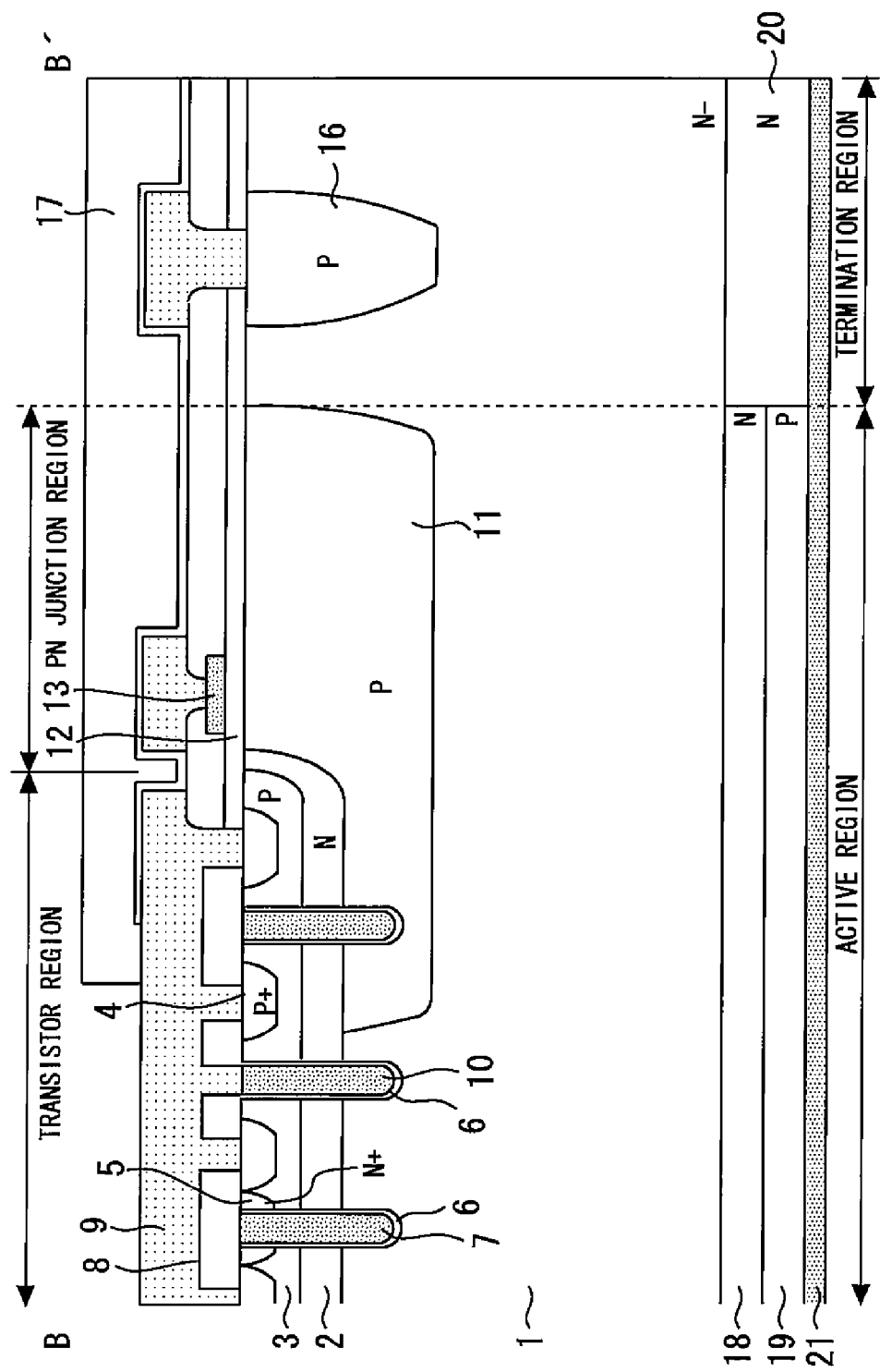
FIG. 17 is a cross-sectional view illustrating modification example 2 of the semiconductor device according to Embodiment 1 of the present invention.

FIG. 17 is a cross-sectional view illustrating modification example 2 of the semiconductor device according to Embodiment 1 of the present invention. Modification example 2 is different from Embodiment 1 in that there is neither N type layer 14 nor P type layer 15 and the P type layer 11 has no contact with the emitter electrode 9. Thus, carriers are less likely to be generated in the termination region when the IGBT is in an ON-state and the carrier concentration on the emitter side decreases at the time of turn-off. Furthermore, relaxation of the electric field on the boundary between the PN junction region and the termination region accelerates depletion toward the collector side, suppresses thermal destruction by a local temperature rise and can suppress an increase of the current density in the PN junction region. Furthermore, extending a current flow path in the PN junction region causes the resistance component to increase. This makes it possible to suppress a high local electric field in the PN junction region and suppress an ion impact phenomenon caused by high electric field strength. As a result, it is possible to suppress a local temperature rise and improve a current breaking capability during the turn-off operation of the IGBT.

In the present embodiment, note that the boundary between the N type buffer layer 18 and the N type buffer layer 20 is located on the boundary between the PN junction region and the termination region. However, without being limited by this, the boundary may be located inside the PN junction region, on the boundary between the active region and the PN junction region or inside the termination region.

Figure 18:
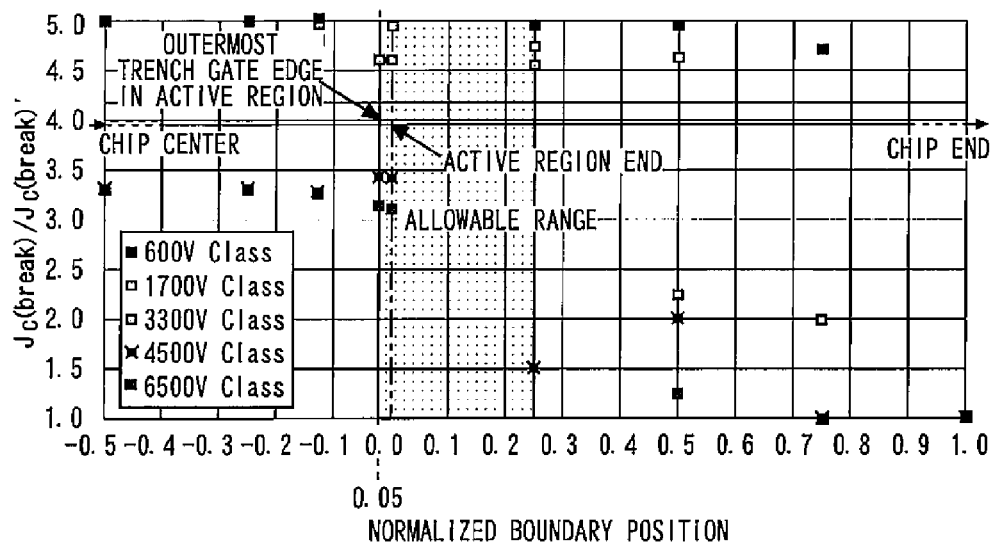
FIG. 18 is a diagram illustrating a relationship between a boundary position of the N type buffer layer and turn-off characteristics.
Figure 19:
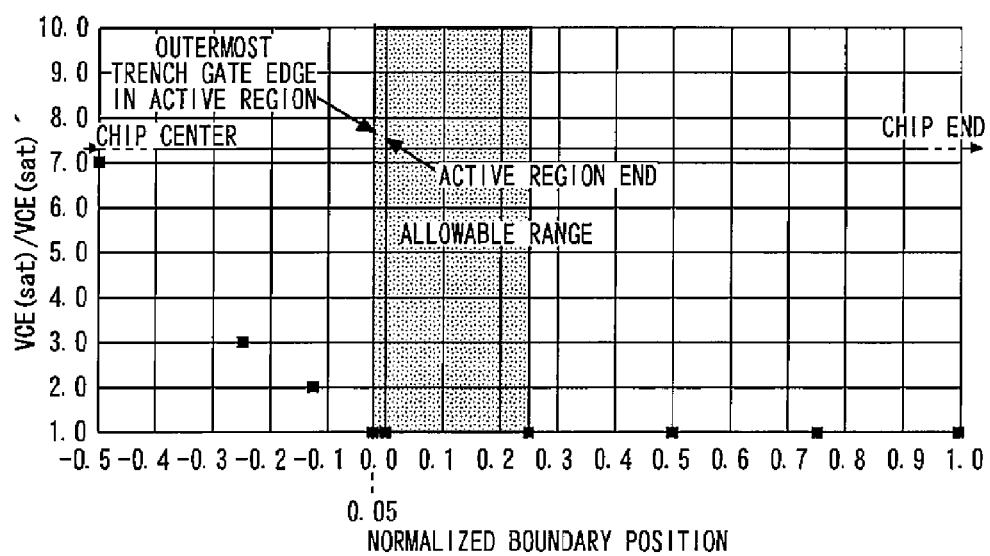
FIG. 19 is a diagram illustrating a relationship between a boundary position of the N type buffer layer and ON-voltage characteristics.

FIG. 18 is a diagram illustrating a relationship between a boundary position of the N type buffer layer and turn-off characteristics. FIG. 19 is a diagram illustrating a relationship between a boundary position of the N type buffer layer and ON-voltage characteristics. The vertical axis in FIG. 18 shows values obtained by standardizing a maximum current density Jc (break) interruptible by the device without destruction at the time of turn-off with reference to the value Jc (break)' in comparative example 1. The vertical axis in FIG.

19 shows values obtained by standardizing an ON-voltage VCE (sat) with reference to the value VCE (sat)' in comparative example 1. On the horizontal axis, it is assumed that the boundary between the PN junction region and the termination region is origin 0, the chip end is +1, and the chip center is −1. Improving the turn-off breaking capability without adversely influencing the ON-state of the IGBT requires the boundary position to be set to −0.05 or more. This position is an outer edge of the outermost circumferential trench gate in the transistor region.

Embodiment 2

Figure 20:
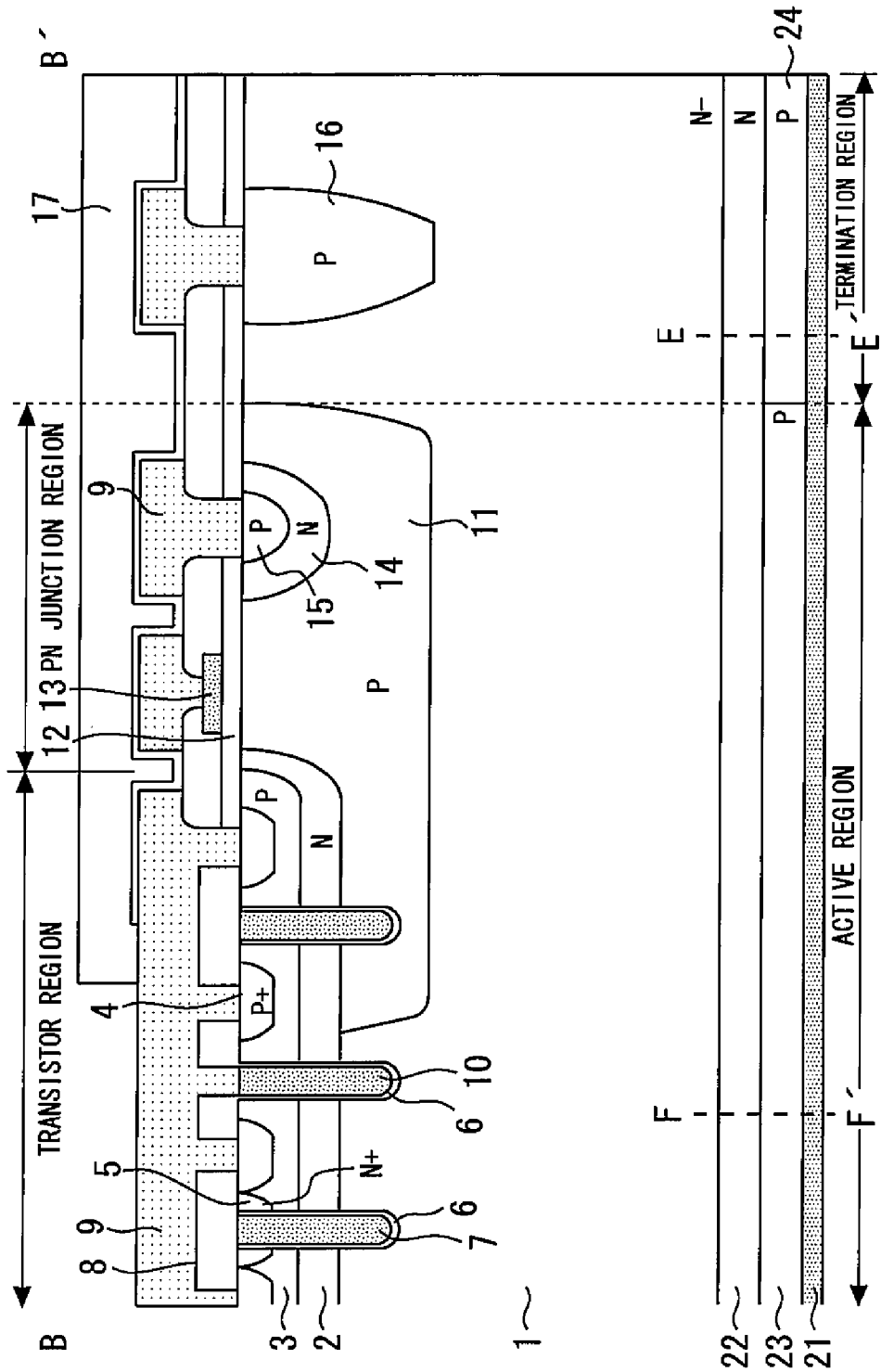
FIG. 20 is a cross-sectional view illustrating a semiconductor device according to Embodiment 2 of the present invention.

FIG. 20 is a cross-sectional view illustrating a semiconductor device according to Embodiment 2 of the present invention. In the transistor region and the termination region, an N type buffer layer 22 is provided below the N⁻ type drift layer 1. In the transistor region and the PN junction region, a P type collector layer 23 is provided below the N type buffer layer 22. In the termination region, a P type collector layer 24 is provided below the N type buffer layer 22. The collector electrode 21 is connected to the P type collector layers 23 and 24. The rest of the configuration is the same as that of Embodiment 1.

Figure 21:
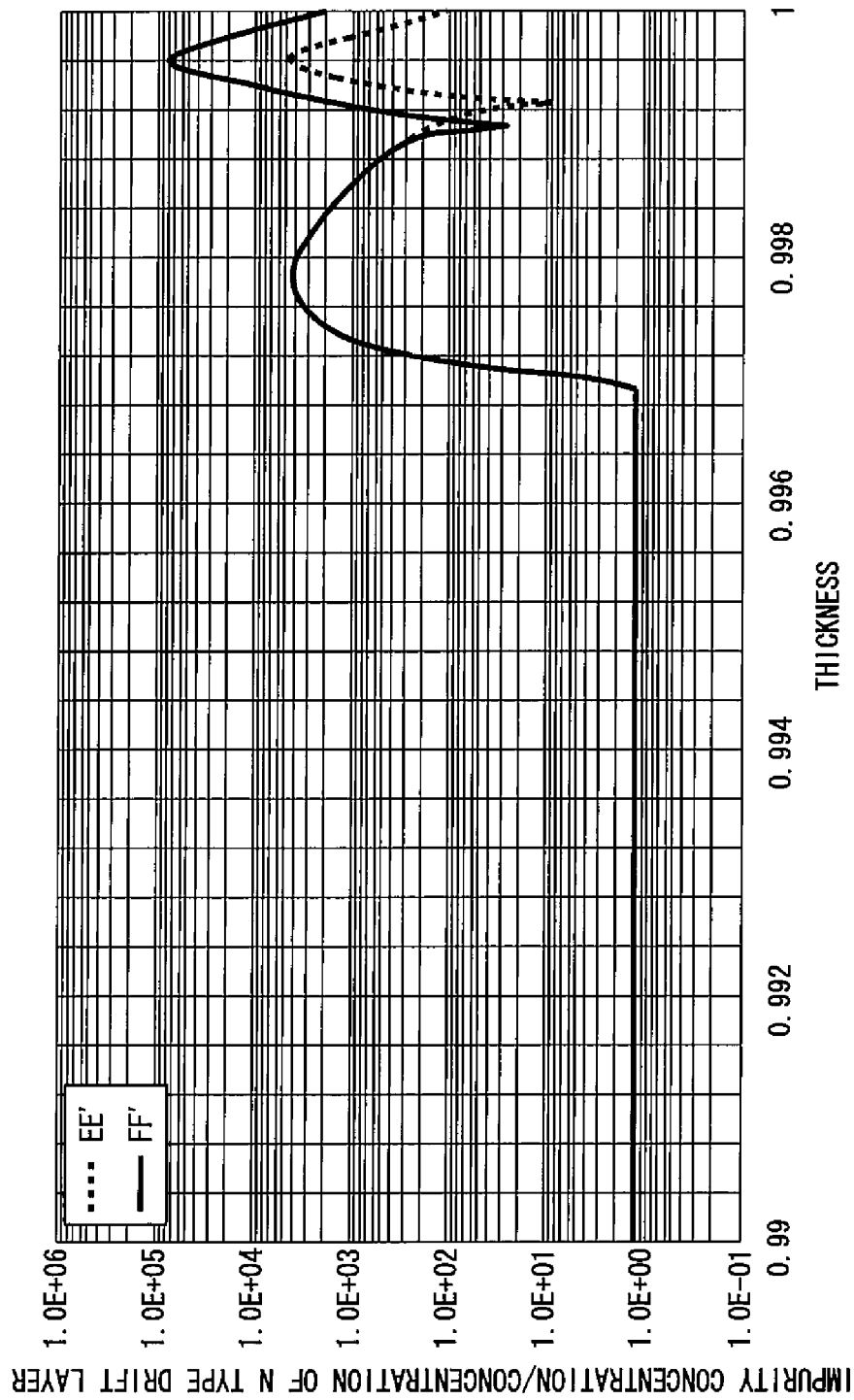
FIG. 21 is a diagram illustrating impurity concentration distributions along E-E' and F-F' in FIG. 20.

FIG. 21 is a diagram illustrating impurity concentration distributions along E-E' and F-F' in FIG. 20. A peak impurity concentration of the P type collector layer 24 is higher than that of the N⁻ type drift layer 1 and lower than that of the N type buffer layer 22. The P type collector layer 24 does not form any ohmic contact with the collector electrode 21.

Next, effects of Embodiment 2 will be described. In Embodiment 2, when a reverse withstand voltage is applied to the IGBT (emitter: high potential, collector: low potential), the P type collector layer 24 and the N type buffer layer 22 constitute a PN junction, thereby have a reverse withstand voltage, improve the reverse voltage tolerance of the IGBT, and can suppress the leakage current in a reverse withstand voltage mode.

Furthermore, in Embodiment 2, the peak impurity concentration of the P type collector layer 24 is higher than that of the N⁻ type drift layer 1 and lower than that of the N type buffer layer 22. Since this prevents holes from being injected from the collector side in the termination region when the IGBT is in an ON-state, it is possible to suppress an increase of the carrier concentration of the termination region. As a result, it is possible to suppress a local temperature rise and improve the current breaking capability during turn-off operation of the IGBT.

Figure 22:
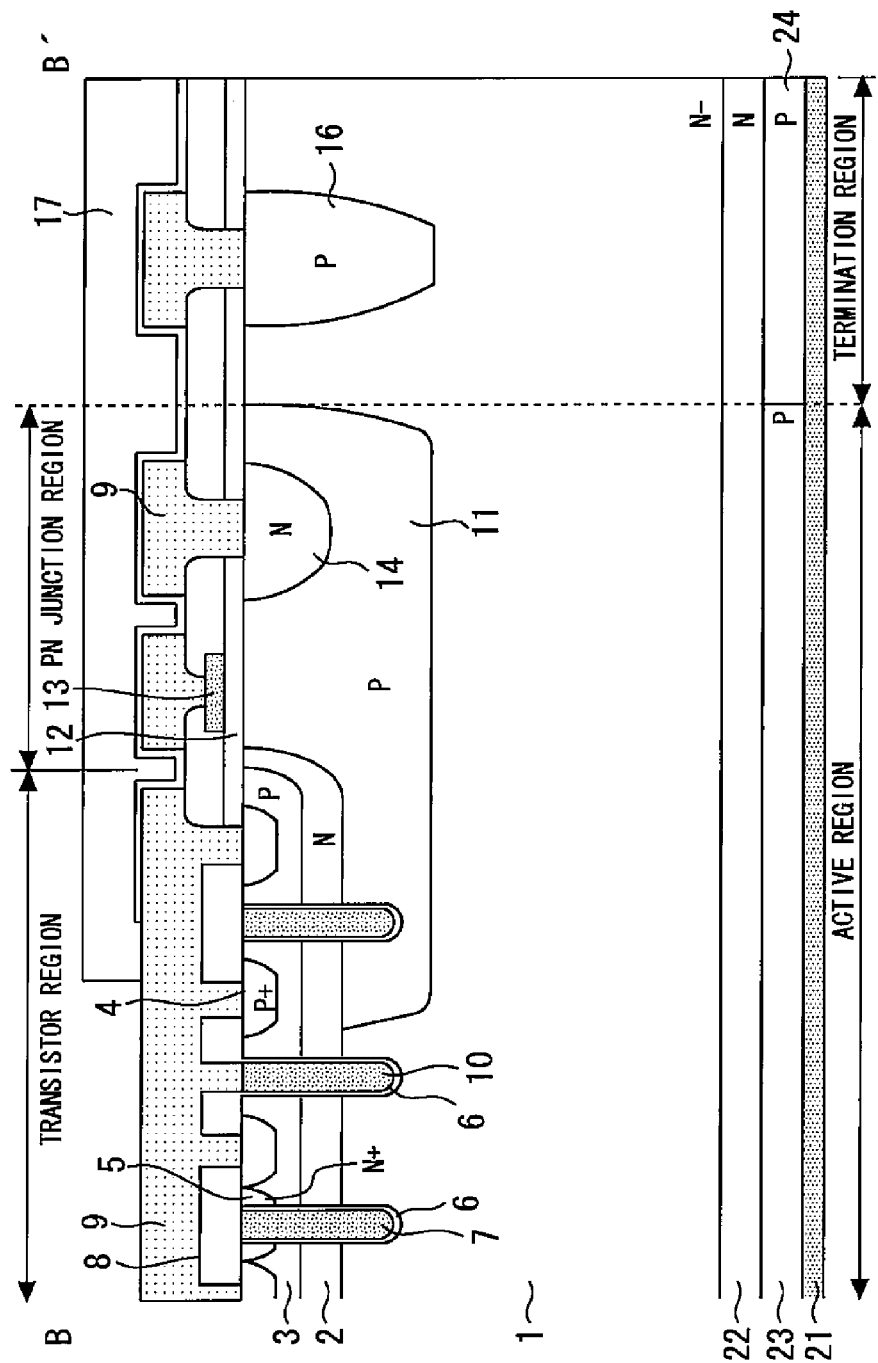
FIG. 22 is a cross-sectional view illustrating modification example 1 of the semiconductor device according to Embodiment 2 of the present invention.

FIG. 22 is a cross-sectional view illustrating modification example 1 of the semiconductor device according to Embodiment 2 of the present invention. It is different from Embodiment 2 in that there is no P type layer 15. In this case, the resistance component of the N type layer 14 can suppress a high local electric field in the PN junction region and suppress an ion impact phenomenon caused by the high electric field strength. As a result, it is possible to suppress a local temperature rise and improve the current breaking capability during turn-off operation of the IGBT.

Figure 23:
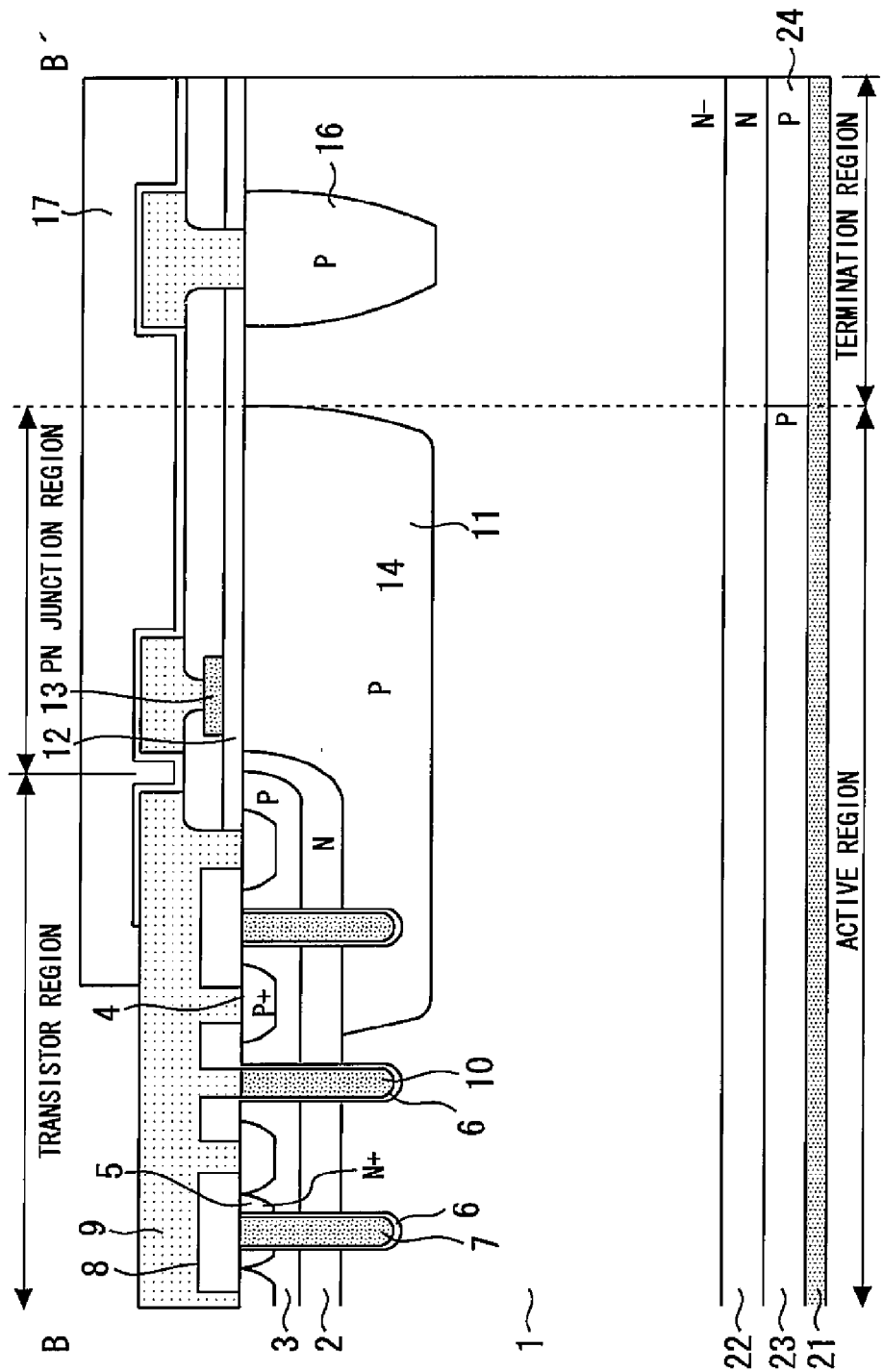
FIG. 23 is a cross-sectional view illustrating modification example 2 of the semiconductor device according to Embodiment 2 of the present invention.

FIG. 23 is a cross-sectional view illustrating modification example 2 of the semiconductor device according to Embodiment 2 of the present invention. It is different from Embodiment 2 in that there is neither N type layer 14 nor P type layer 15, and there is no contact between the P type layer 11 and the emitter electrode 9. Thus, carriers are less likely to be generated in the termination region when the IGBT is in an ON-state and the carrier concentration on the emitter side decreases at the time of turn-off. Furthermore, relaxation of the electric field on the boundary between the PN junction region and the termination region accelerates depletion toward the collector side, suppresses thermal destruction by a local temperature rise and can suppress an increase of the current density in the PN junction region. Furthermore, extending a current flow path in the PN junction region causes the resistance component to increase. This makes it possible to suppress a high local electric field in the PN junction region and suppress an ion impact phenomenon caused by high electric field strength. As a result, it is possible to suppress a local temperature rise and improve a current breaking capability during the turn-off operation of the IGBT.

The above embodiment has described the semiconductor device with a high withstand voltage of 4500 V, but the above effects can be obtained irrespective of the withstand voltage. Furthermore, a case has been described in the above embodiment where the IGBT in the transistor region has a trench gate structure, but the above effects can also be obtained in the case of a flat gate structure. Furthermore, a case has been described where a guard ring made up of the P type layer 16 is formed in the termination region, but the above effects can also be obtained in other structures that maintain a withstand voltage.

Furthermore, the semiconductor device according to the above embodiment is not limited to one formed of silicon, and one formed of a wide-band gap semiconductor having a larger band gap than silicon can also obtain the effects according to the present embodiment. Examples of the wide-band gap semiconductor include silicon carbide, nitride gallium-based material or diamond. Since the semiconductor device formed of such a wide-band gap semiconductor has a high withstand voltage and high allowable current density, the size of the device can be reduced. Using this small-sized semiconductor device can also reduce the size of a semiconductor module incorporating this device. Furthermore, since the semiconductor device has high heat resistance, it is possible to reduce the size of radiator fins of a heat sink and substitute a water-cooling section by an air-cooling section, and thereby further reduce the size of the semiconductor module. Furthermore, since the semiconductor device has less power loss and provides high efficiency, it is possible to improve the efficiency of the semiconductor module.

DESCRIPTION OF SYMBOLS

1 N⁻ type drift layer
7 gate electrode
9 emitter electrode
11 P type layer (first P type layer)
12 insulating film
13 gate wiring
14 N type layer
15 P type layer (second P type layer)
18 N type buffer layer (first N type buffer layer)
19 P type collector layer
20 N type buffer layer (second N type buffer layer)
21 collector electrode
22 N type buffer layer
23 P type collector layer (first P type collector layer)
24 P type collector layer (second P type collector layer)

The invention claimed is:
1. A semiconductor device comprising:
a transistor region in which an insulated gate bipolar transistor having a gate electrode and an emitter electrode is provided; and
a termination region arranged around the transistor region, wherein a first N type buffer layer is provided below an N type drift layer in the transistor region, a P type collector layer is provided below the first N type buffer layer, a second N type buffer layer is provided below the N type drift layer in the termination region, a collector electrode is directly connected to the P type collector layer and the second N type buffer layer, an impurity concentration of the second N type buffer layer decreases as a distance from the collector electrode decreases, and the second N type buffer layer does not form any ohmic contact with the collector electrode.

2. The semiconductor device according to claim 1, further comprising a PN junction region arranged between the transistor region and the termination region, wherein a first P type layer is provided on the N type drift layer in the PN junction region, a gate wiring is provided on the first P type layer via an insulating film, and the gate wiring is connected to the gate electrode.

3. The semiconductor device according to claim 2, wherein an N type layer is provided on the first P type layer, and the N type layer is connected to the emitter electrode.

4. The semiconductor device according to claim 3, wherein a second P type layer is provided between the N type layer and the emitter electrode.

* * * * *